(12) United States Patent
Antolik

(10) Patent No.: US 7,211,170 B2
(45) Date of Patent: May 1, 2007

(54) TWIST-N-LOCK WAFER AREA PRESSURE RING AND ASSEMBLY

(75) Inventor: Jerrel K. Antolik, Livermore, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/916,784

(22) Filed: Jul. 27, 2001

(65) Prior Publication Data

US 2002/0139479 A1   Oct. 3, 2002

Related U.S. Application Data

(60) Provisional application No. 60/281,049, filed on Apr. 2, 2001.

(51) Int. Cl.
*H01L 21/00* (2006.01)
*C23C 16/00* (2006.01)

(52) U.S. Cl. ............ 156/915; 156/345.53; 156/345.51; 118/715; 118/723 R; 118/500; 204/298.1; 216/67

(58) Field of Classification Search ............ 156/345.2, 156/915, 345.51, 345.53; 118/715–733, 118/500; 235/27; 204/298.1
See application file for complete search history.

(56) References Cited

U.S. PATENT DOCUMENTS 5,534,751 A * 7/1996 Lenz et al. .............. 315/111.71
6,113,704 A * 9/2000 Satoh et al. ................ 118/728

FOREIGN PATENT DOCUMENTS

JP          11214487 A   *  8/1999

* cited by examiner

*Primary Examiner*—Ram N. Kackar
(74) *Attorney, Agent, or Firm*—IP Strategy Group, P.C.

(57) ABSTRACT

Wafer area pressure rings used to confine plasma in plasma processing chambers which are manufactured with bores therein such that replacement of the pressure rings during routine or repair maintenance is significantly eased. The bores allows the pressure rings to be installed by simply aligning the bores under hanging adapters which are connected to the ceiling of the chamber, lifting the rings such that the hanging adapters enter the ring, turning or twisting the entire apparatus a miniscule amount, and then lowering the ring apparatus on the hanging apparatus, thereby locking the rings in place.

14 Claims, 12 Drawing Sheets

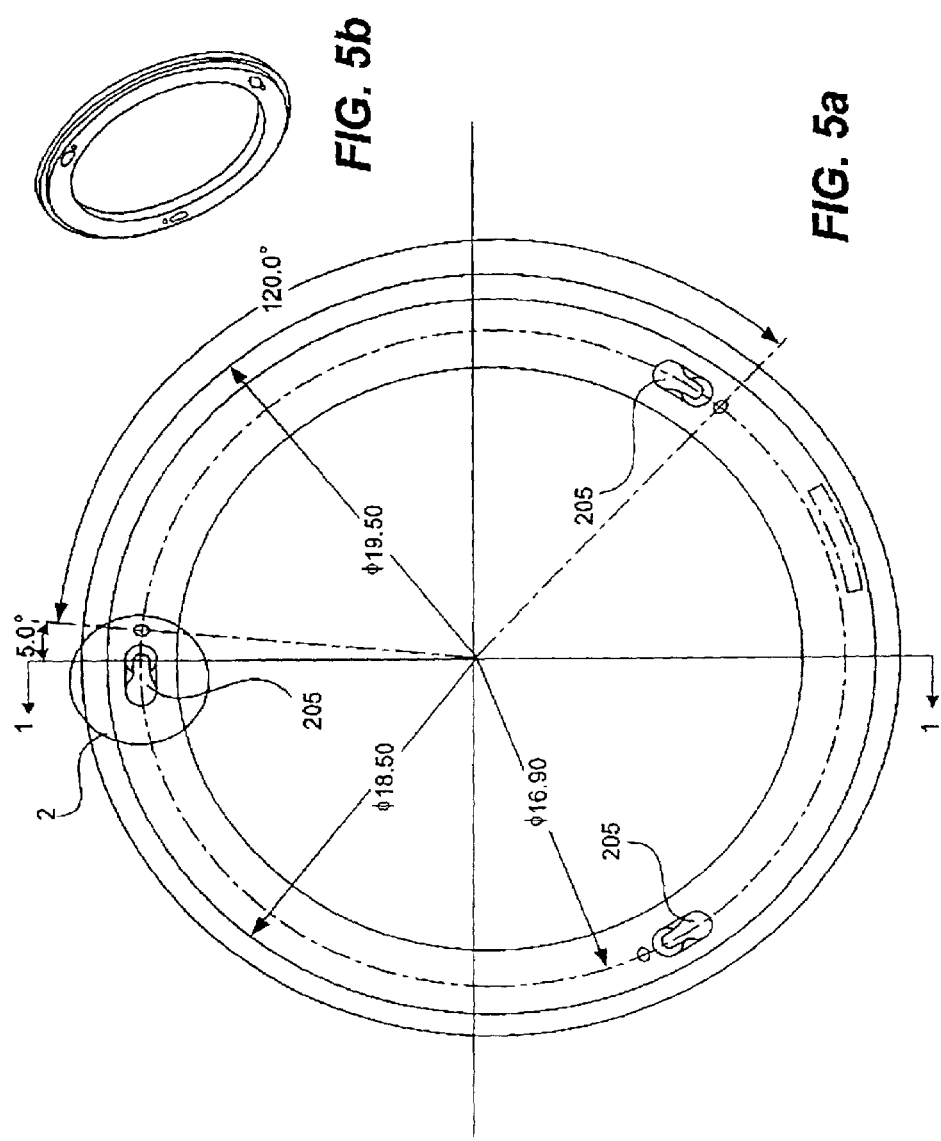

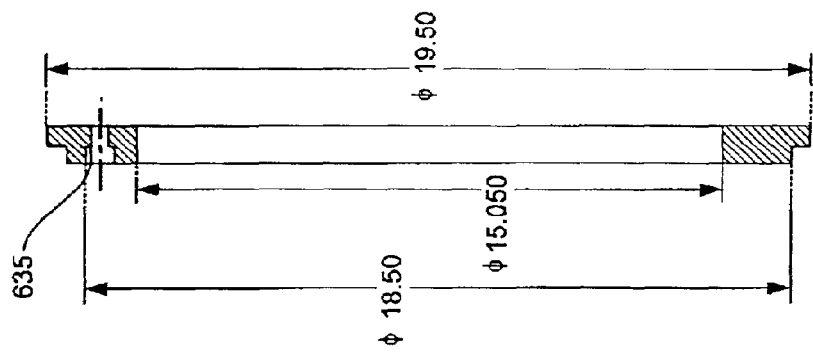
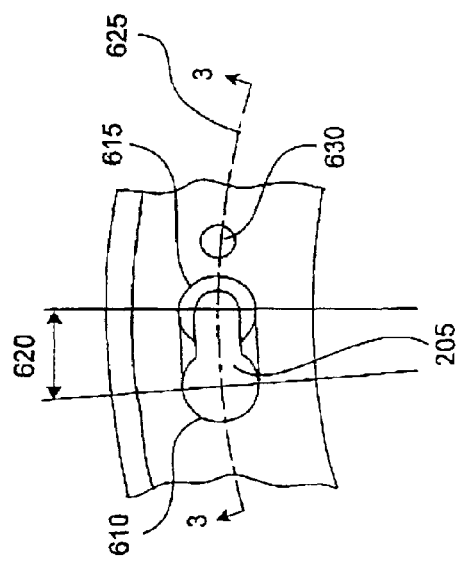
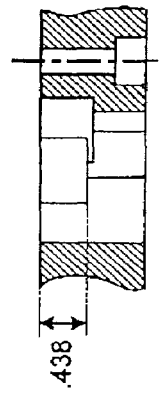

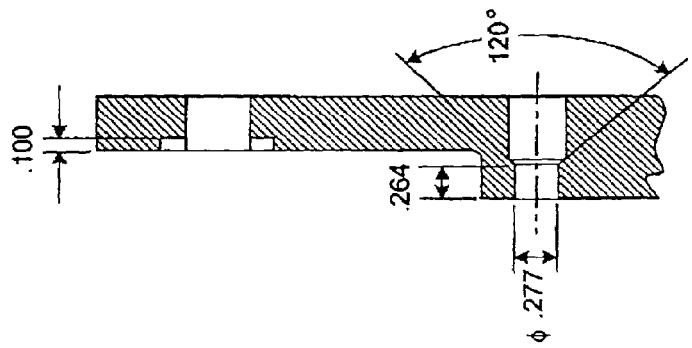
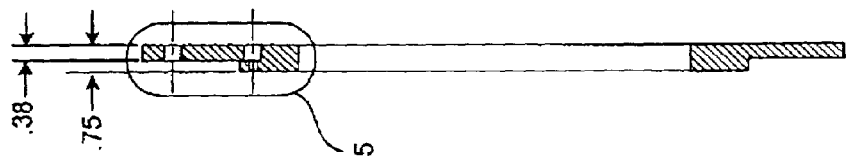
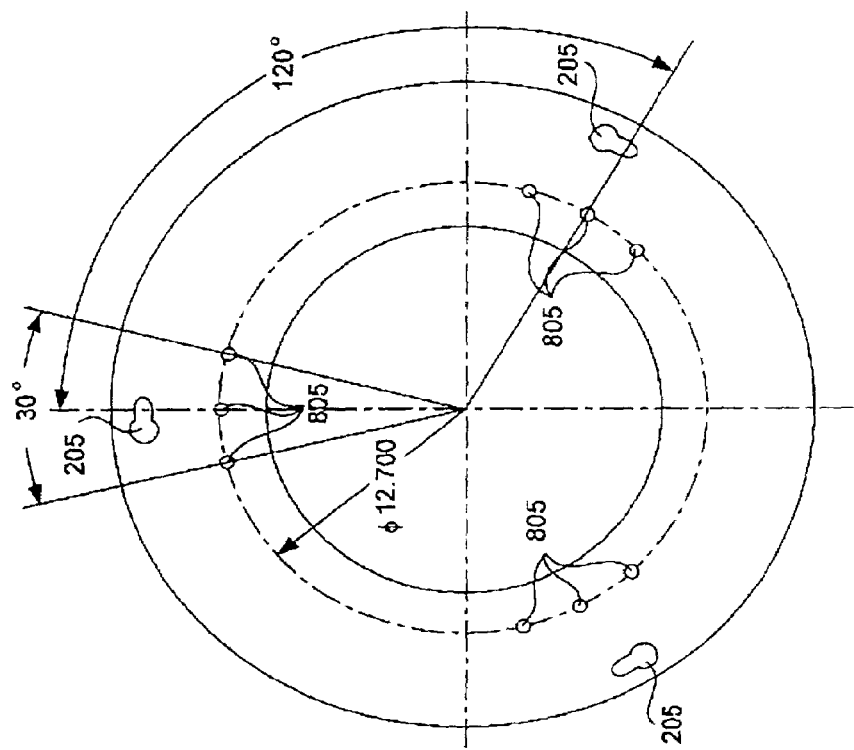

TWIST-N-LOCK WAFER AREA PRESSURE RING AND ASSEMBLY

CROSS REFERENCE TO RELATED APPLICATION

This application claims priority from U.S. Provisional Patent Application Ser. No. 60/281,049 filed Apr. 2, 2001.

BACKGROUND OF THE INVENTION

The present invention relates to methods and apparatus used to control the pressure around and above a substrate. More particularly, the present invention relates to improved wafer area pressure control rings.

In the fabrication of semiconductor-based devices (e.g., integrated circuits) layers of material may alternately be deposited onto and etched from a substrate (e.g., the semiconductor wafer). As is well known in the art, the etching of the deposited layers may be accomplished by a variety of techniques, including plasma enhanced etching. In plasma-enhanced etching, the actual etching of the substrate takes place inside a plasma processing chamber. During etching, a plasma is formed from a suitable etchant source gas to etch areas of the substrate that are unprotected by the mask, leaving behind the desired pattern.

Among different types of plasma etching systems, those utilizing confinement rings have proven to be highly suitable for efficient production and/or for forming the ever shrinking features on the substrate. An example of such a system may be found in the commonly assigned U.S. Pat. No. 5,534,751, which is incorporated by reference herein. Although the use of confinement rings results in a significant improvement in the performance of plasma processing systems, current implementations can be improved. In particular, it is realized that improvements can be made in the way in which confinement rings are maintenanced and replaced. More particularly, significant improvements can be made in the way in which these rings are attached within the chamber.

To facilitate discussion, FIG. 1 depicts a current wafer area pressure (WAP) ring hanger assembly. The prior art design as shown by FIG. 1, required a technician to the hold the WAP ring assembly 100 in place, while another technician fastened screw 105 and clamp 130 to suspend the ring from the plunger shaft 115 of the upper chamber assembly. Although not shown in FIG. 1, but known to those of ordinary skill in the art, typically the pressure ring assembly 100 is attached at three points, each spaced 120 degrees from one another, further complicating assembly.

The ring assembly 100 is typically a composite of 4 rings which (the top ring, ring no. 4, 125 being the thickest) according to desired pressure requirements can be raised or lowered with the aid of the stepped hanger 110. The operation of removing and reinstalling the WAP ring assembly has been identified as an ergonomic safety issue. Additionally, the use of tools and fasteners in conjunction with the installation and removal of the WAP rings increases the opportunity for ring damage, dropping of parts (e.g., screws and washers) into the pump, as well as an increased time component for replacement. It should be noted that the stepped hanger 110 is one continuous piece, i.e., the stepped portion is attached directly to the plunger shaft 115.

The combined hanger/stepped hanger design of the prior art is also unwieldy because while the technician is attaching the hanger to the plunger shaft, the quartz rings are loosely floating and must be securely held while the technician secures the screw 105 to the plunger shaft 115. Accordingly, it is desirable to simplify the removal and installation of these rings.

SUMMARY OF THE INVENTION

The Twist-N-Lock WAP ring assembly simplifies the existing WAP ring assembly by improving the method of suspending the WAP ring assembly from the cam plungers of the Dual Frequency Confined upper chamber assembly. The invention includes two design features: 1) unique stepped counter-bored radial slots in the top WAP ring(s); and 2) three Twist-N-Lock adapters fastened to the cam plungers. These features eliminate the requirement for tools or fasteners to perform the operation of removing and reinstalling the WAP ring assembly. The invention allows one technician to lift and twist the WAP ring assembly 5 degrees for installation and removal. Since no tools or fasteners are required, potential damage to the WAP ring assembly is reduced during the operation of removing and reinstalling. The present invention also separates the stepped hanger from the chamber hanger, reducing complexity in installation by separating the two functions. The time to perform the operation is reduced from 5 minutes to approximately 15 seconds, thus reducing MTTR (mean time to repair).

Two embodiments of the invention are given: one for processing 300 mm substrates and one for processing 200 mm substrates. The implementation with respect to both the 300 mm and 200 mm version is identical, but for the fact that the reduced ring size of the 200 mm ring creates special considerations with respect to the stepped hanger. In the 300 mm implementation the hanger drops into the cavity around the lower electrode. However, in the 200 mm version, the stepped hanger (absent modification) would contact directly with the lower electrode. Thus, in the 200 mm implementation, the single stepped hanger (of which there are three; i.e., one placed every 120 degrees) is replaced with 3 different sizes of hanging shafts which are loosely hung from the top ring allowing free movement upward when the shaft comes in contact with the lower electrode.

Additional advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The present invention is illustrated by way of example, and not by way of limitation, in the figures of the accompanying drawings and in which like reference numerals refer to similar elements and in which:

FIG. 5a is a bottom view of a 300 mm Twist-N-Lock WAP ring, with a bottom perspective given in FIG. 5b.

FIG. 6a is an expanded schematic of detail 2 of FIG. 5 showing the hanging bore.

FIG. 6b is a cut-out view of the hanging bore taken through line 3—3 of FIG. 6a.

FIG. 6c is a cross sectional view of the 300 mm Twist-N-Lock WAP ring taken through line 1—1 of FIG. 5.

FIG. 9a is a top view of a 200 mm Twist-N-Lock WAP ring.

FIG. 9b is a cross sectional view of the 200 mm Twist-N-Lock WAP ring taken through line 4—4 of FIG. 8.

FIG. 9c is a magnified schematic of detail 5 identified in FIG. 9b.

DETAILED DESCRIPTION OF THE PREFERRED EMBODIMENTS

The present invention will now be described in detail with reference to a few preferred embodiments thereof as illustrated in the accompanying drawings. In the following descriptions, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
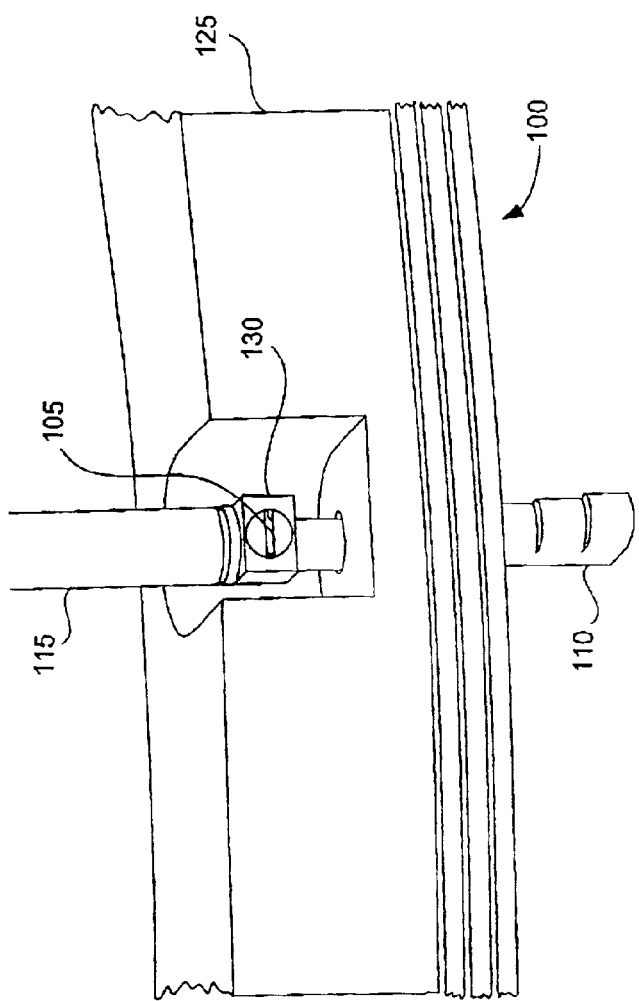
FIG. 1 is a schematic section view of a prior art WAP ring assembly and attachment assembly.
Figure 2:
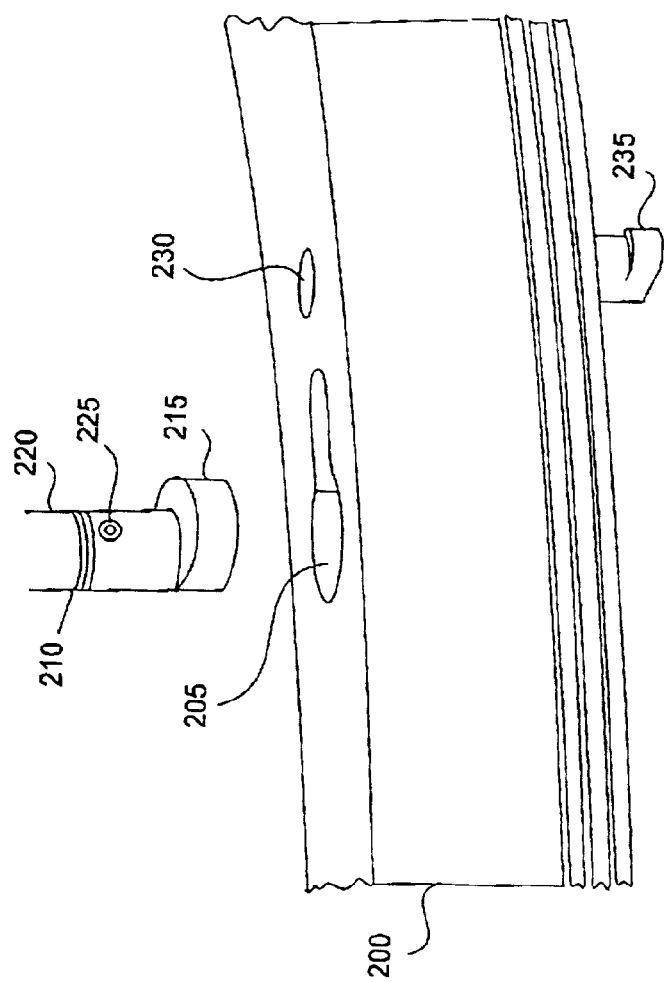
FIG. 2 is a schematic section view of a 300 mm Twist-N-Lock WAP ring and attachment assembly.

To facilitate discussion, FIG. 2 is a schematic view of a Twist-N-Lock WAP ring 200, including the Twist-N-Lock bore 205, and the Twist-N-Lock WAP ring hanger assembly 210, which is composed of the hanger adapter 215 attached to the plunger shaft 220. The hanger adapter 215 is attached via alien bolt 225. Further, the 300 mm Twist-N-Lock WAP ring also contains a hanger hole 230, for attaching the stepped hanger 235.

Figure 3:
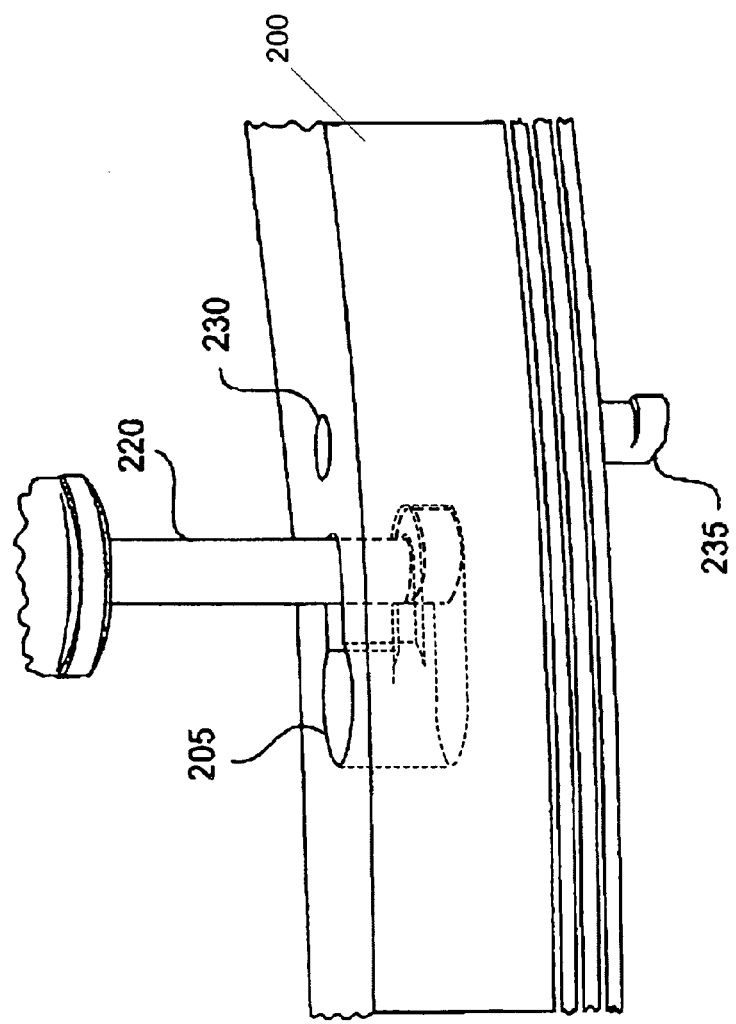
FIG. 3 is a schematic section view of an installed 300 mm Twist-N-Lock WAP ring assembly.
Figure 4B:
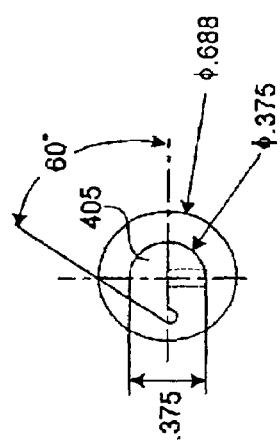
FIG. 4b showing a top-view.
Figure 4D:
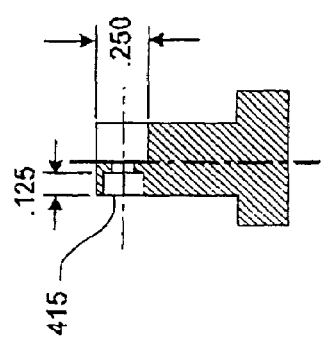
FIG. 4d showing a cross sectional view.
Figure 4A:
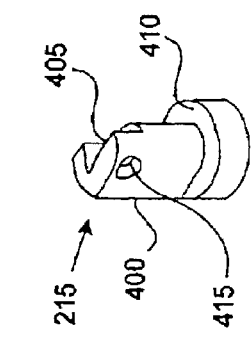
FIG. 4 is a schematic of a WAP Twist-N-Lock hanger adapter with FIG. 4a showing a perspective.
FIG. 4c, showing a side view.
Figure 4C:
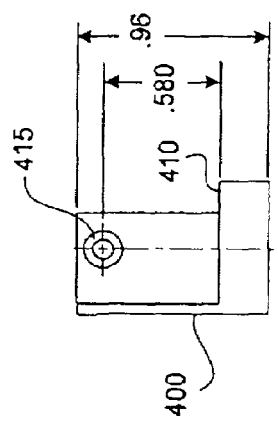

FIG. 3 is a schematic diagram of an installed Twist-N-Lock WAP hanger assembly. Referring back to FIG. 2, to install the Twist-N-Lock WAP ring assembly, the receiving or forward portion of the Twist-N-Lock bore 205 is aligned below the WAP hanger assembly 210. The ring is then lifted into position such that the hanger assembly 210 enters the receiving bore 205 upon which the WAP ring is twisted or turned approximately 5 degrees clockwise and then slightly lowered to lock the WAP ring into position as shown in FIG. 3.

FIG. 4 shows various perspectives of the Twist-N-Lock hanger adapter 215. Referring to FIG. 4a, the adapter is primarily comprised of the main body portion 400, L notch 405 and the hanging lip 410. The adapter is designed to be installed in conjunction with existing cam plungers for easy retrofit. To this end, the top portion contains the L notch 400 such that it fits snugly with the counter notched bottom portion of the plunger shaft. The L shaped notch prevents "cowbelling" or swinging of the adapter. The hanging lip 410 allows the ring to longitudinally contact the hanger, allowing the ring to hang from the hanger adapter and by extension, the hanger assembly. Attachment hole 415 allows attachment of the hanger adapter to the plunger shaft. Dimensions are given in FIG. 4 and shown in inches.

Figure 7C:
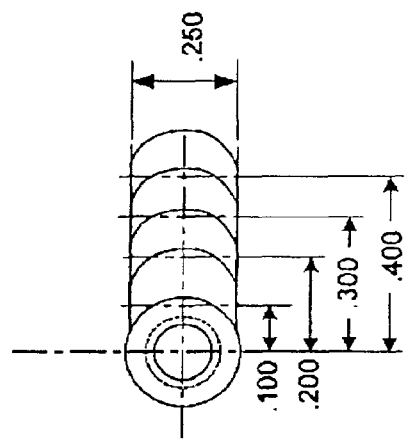
FIG. 7c is a top view of the 300 mm Twist-N-Lock stepped hanger.
Figure 7B:
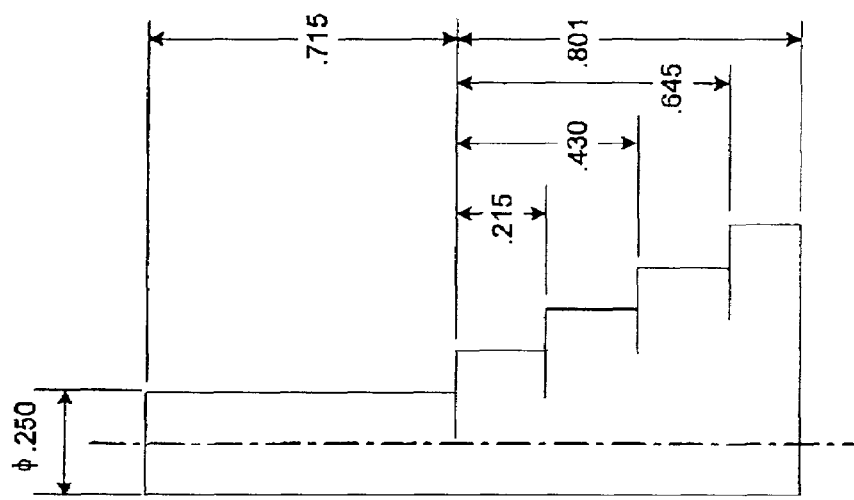
FIG. 7b is a side view schematic of the 300 mm Twist-N-Lock stepped hanger.
Figure 7A:
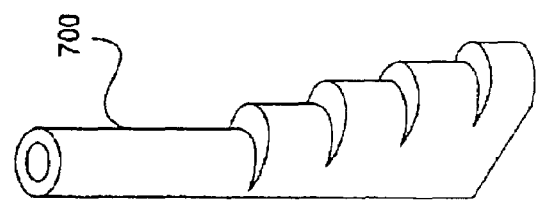
FIG. 7a is a perspective view of the 300 mm Twist-N-Lock stepped hanger.

FIG. 5a is a bottom view schematic diagram of a Twist-N-Lock WAP ring used in conjunction with processing 300 mm wafer substrates. Three Twist-N-Lock bores 205 are machined every 120 degrees. FIG. 6 is a schematic which shows the detail of the Twist-N-Lock bore. The Twist-N-Lock bore 205 is essentially elliptically composed of two circular bores 610 and 615 machined next to one another (the reception bore 610 and the lock bore 615) and set 5 degrees apart 620 on the same radial line 625. The stepped hanger bore 630 allows independent attachment of the stepped hanger shown in FIG. 7. FIG. 7 is a schematic view of a stepped hanger 700.

FIG. 6b shows a cross section of the Twist-N-Lock bore 205 taken through line 3—3 of FIG. 6a. The bottom of the WAP Twist-N-Lock bore is elliptical, the result of machining both the receiving bore 610 and the lock bore 615 completely through the quartz on the underside of the WAP ring. The elliptical bottom of the bore must be of a width minimally as wide as the diameter of the bottom of the hanger adapter 410 (i.e., the bottom lip portion). This allows unfettered passage to the locking bore. The portion of hanging bore which extends through the top of the ring must allow passage of the plunger shaft and hanger adapter assembly to pass to the lock bore during the 5 degree clock-wise twist. This shaft passage minimally must be as wide as the shaft portion of the hanger adapter to allow unfettered passage to the locking bore. Unlike the reception bore, the lock bore does not continue through the top of the WAP Twist-N-Lock ring. Instead, it ends, creating a lip, 635 which allows the hanger adapter lip to contact the lock bore lip, creating a secure platform.

FIG. 7 shows several views of the modified stepped hanger attachment. The modified stepped hanger attachment can be attached to the WAP Twist-N-Lock ring through the stepped hanger attachment hole by conventional means, such as a screw. It should be noted that the ring assembly (i.e., the multiple rings) can be step hung together prior to the opening of the chamber. Dimension of the stepped hanger attachment are given in inches in FIG. 7.

Figure 8B:
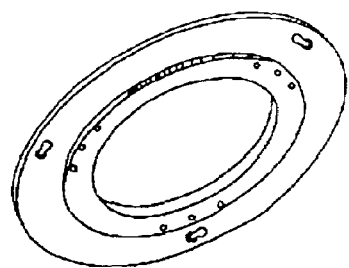
FIG. 8b shows a perspective bottom view of a 200 mm Twist-N-Lock WAP ring.
Figure 8A:
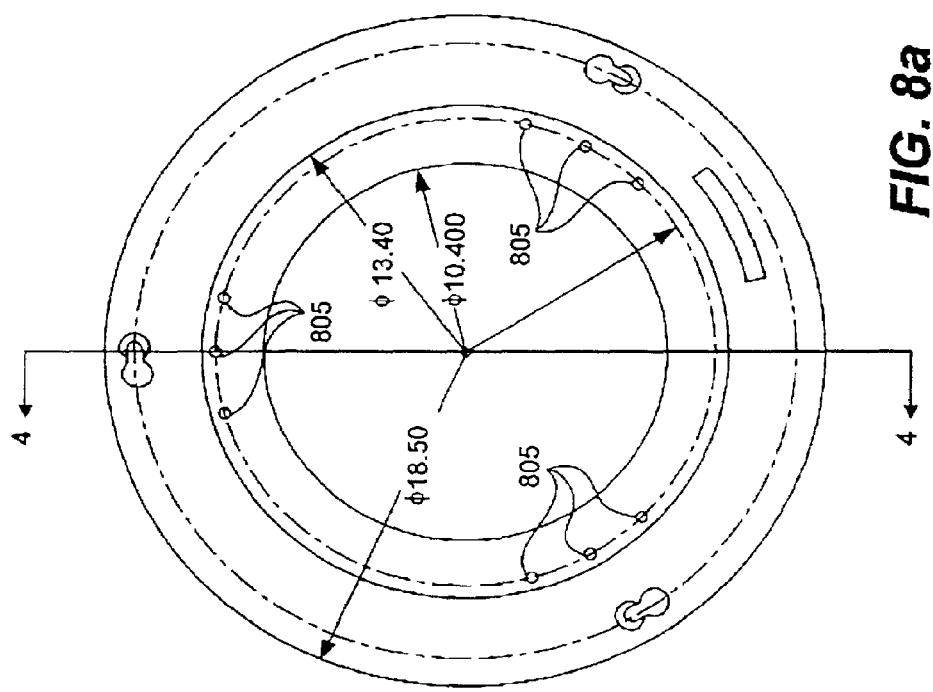
FIG. 8a is a bottom view of a 200 mm Twist-N-Lock WAP ring.

FIG. 8a shows a bottom schematic view of the 200 mm Twist-N-Lock ring with relevant dimensions given in inches. The hanging bore configuration is identical to that of the 300 mm ring. However, due to the decreased size (i.e., diameter) of the 200 mm ring, the stepped hanger if left in the same relative position, would strike the electrostatic chuck and not allow rings to collapse or the chamber to be shut properly. Therefore, the stepped hanger must be disposed of and the stepping of the rings handled differently. This is done by machining three sets of step shaft bores 805 in the ring. Placed in the three step shaft bore are three step shafts of different but consistent lengths, i.e, the first set is 0.924 inches long, second set, 1.140 inches long and the third set is 1.354 inches long. FIGS. 9b and 9c show the step shaft holes in greater detail, with FIG. 9c showing a magnified cross section of detail 5 in FIG. 9b. The step shaft bore is comprised of two portions; the shaft bore and the nut bore.

Figure 10C:
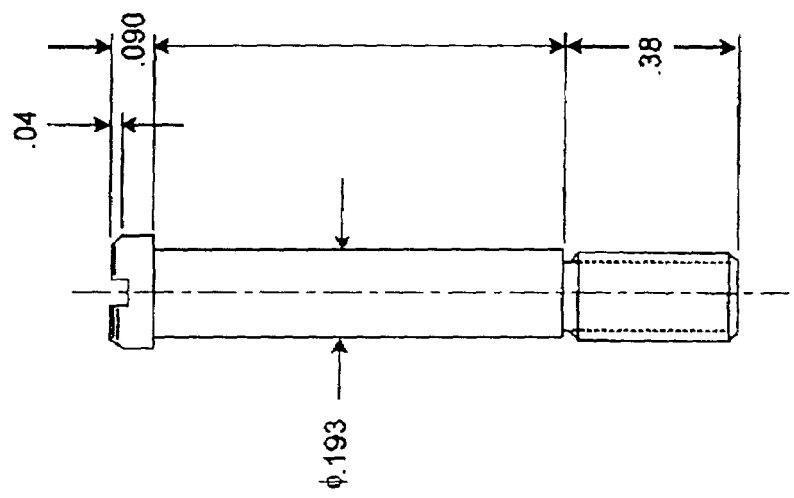
FIG. 10 is a schematic of the 200 mm WAP ring hanger, with various perspectives.
Figure 10B:
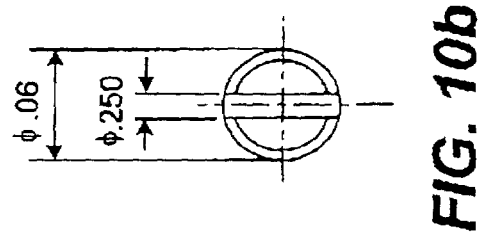
Figure 10A:
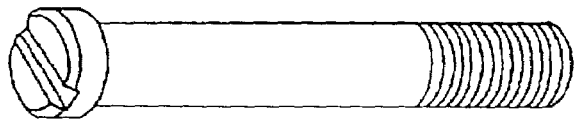

FIG. 10 shows a schematic of the step shaft. The primary design consideration of the stepped shaft bore is that the nut bore be of greater diameter than the shaft bore, allowing the step shaft to float loosely from the ring. Ideally the bottom of the nut bore is chamfered to allow seating of the nut.

Figure 11C:
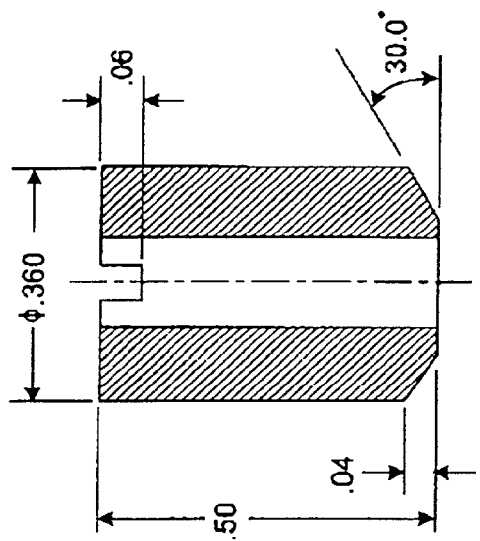
FIG. 11 is a schematic of a WAP ring hanger nut with FIG. 11a showing a perspective schematic, FIG. 11b showing a top view and FIG. 11c showing a side view.
Figure 11B:
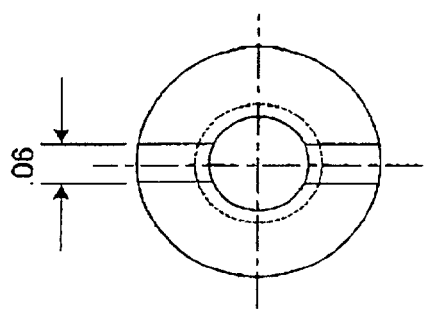
Figure 11A:
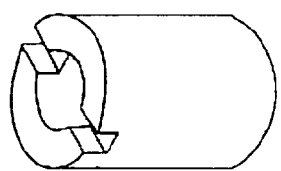
Figure 12:
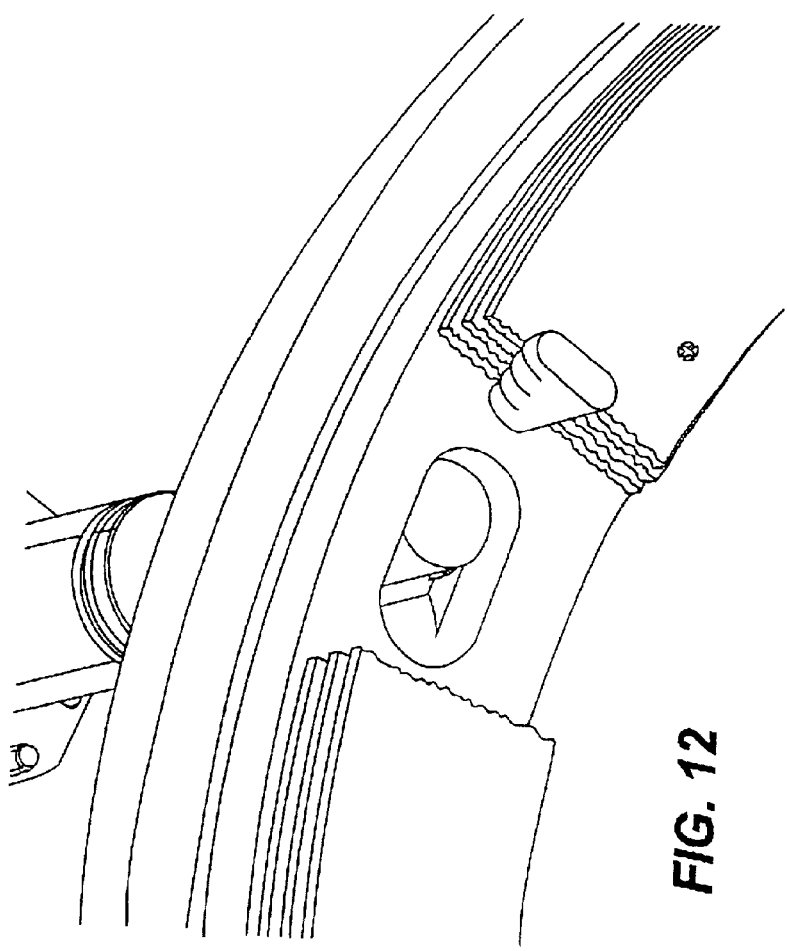
FIG. 12 is a schematic of the installed Twist-N-Lock WAP ring assembly in its locked position viewed from an underside perspective with the 3 lower rings cut-out to expose the assembly.

Referring now to FIG. 10, shown is the schematic of the shaft bore. The distal end is threaded to allow it to be screwed into the nut portion shown in FIG. 11. Three distinct lengths of stepped shafts are required to allow for the difference in floating height of the three WAP rings. Ideally, the nut portion is chamfered to allow for proper seating in the nut bore. Dimensions are given in inches.

What is claimed is:

1. A plasma processing system, comprising:
    a set of rings, including a top ring and a set of lower rings having at least one lower ring;
    a stepped hanger structure coupled to said top ring, said stepped hanger structure supporting said set of lower rings;
    a hanger assembly including a plunger shaft and a hanger adapter lip portion, said hanger adapter lip portion being fixed relative to said plunger shaft;
    a receiving bore defined by a first cavity through said top ring, wherein a longitudinal axis of said first cavity is substantially parallel to a longitudinal axis of said plunger shaft, and wherein said first cavity is larger than said hanger adapter lip portion; and
    a locking bore defined by a second cavity partially through said top ring, wherein said stepped hanger structure is angularly offset from said locking bore, and a longitudinal axis of said second cavity is substantially parallel to said longitudinal axis of said plunger shaft, and wherein said second cavity having a first locking bore portion configured to accommodate said hanger adapter lip portion and a second locking bore portion configured to accommodate said plunger shaft, said second locking bore portion having a smaller cross-sectional dimension than a cross-sectional dimension of said first locking bore portion, and said receiving bore and said locking bore are connected with a shaft passage created through said top ring that at least accommodates a passage by said plunger shaft from said receiving bore to said second locking bore portion of said lock bore, said stepped hanger structure projecting from a first surface of said top ring in a first direction away from said first surface, said hanger assembly, when locked in said locking bore, projects from a second surface of said top ring that is opposite said first surface in a second direction that is opposite from said first direction such that said plunger shaft protrudes through said second surface, said hanger assembly, when said hanger adapter lip is locked in said locking bore, is coupled to said top ring without traversing through said set of lower rings, said stepped hanger structure on the other hand traverses through at least one ring in said set of lower rings when said stepped hanger structure is coupled to said top ring.

2. The plasma processing system of claim 1, wherein each of said set of rings is formed of a dielectric material.

3. The plasma processing system of claim 2, wherein said dielectric material is quartz.

4. The plasma processing system of claim 1, wherein said hanger adapter lip portion is positioned in said locking bore during plasma processing.

5. The plasma processing system of claim 1, wherein said top ring is secured by moving said set of rings in a direction substantially parallel to said longitudinal axis of said plunger shaft to insert said hanger adapter lip portion into said receiving bore of said top ring, and then rotating said set of rings to seat said hanger adapter lip portion into said locking bore.

6. The plasma processing system of claim 5, wherein said stepped hanger structure is fixedly coupled to said top ring of said set of rings such that said stepped hanger structure and said top ring are fixed in position relative to one another when said set of lower rings collapse.

7. The plasma processing system of claim 1, wherein said locking bore is counter-sunk in said first surface of said top ring.

8. A plasma processing system having a plasma processing chamber, comprising:
    a hanger assembly including a plunger shaft and a hanger adapter lip portion, said hanger adapter lip portion being fixed relative to said plunger shaft, said hanger assembly being coupled to a component of said plasma processing chamber; and
    a ring assembly configured to be detachably coupled to said hanger assembly, said ring assembly including
        a set of rings, including a top ring and a set of lower rings having at least one lower ring, and
        a stepped hanger structure coupled to said top ring, said stepped hanger structure supporting said set of lower rings,
            wherein said top ring has a receiving bore defined by a first cavity through said top ring, said first cavity being larger than said hanger adapter lip portion, said top ring also has a locking bore defined by a second cavity partially through said top ring, said second cavity having a first locking bore portion configured to accommodate said hanger adapter lip portion and a second locking bore portion configured to accommodate said plunger shaft, said second locking bore portion having a smaller cross-sectional dimension than a cross-sectional dimension of said first locking bore portion, said stepped hanger structure being angularly offset from said locking bore, said second cavity being configured to receive said hanger adapter lip portion, said receiving bore and said locking bore being connected with a shaft passage created through said top ring that at least accommodates a passage by said plunger shaft from said receiving bore to said lock bore, said stepped hanger structure projecting from a first surface of said top ring in a first direction away from said first surface, said hanger assembly; when locked in said locking bore, projects from a second surface of said top ring that is opposite said first surface in a second direction that is opposite from said first direction such that said plunger shaft protrudes through said second surface, said hanger assembly, when said hanger adapter lip is locked in said locking bore, is coupled to said top ring without traversing through said set of lower rings, said stepped hanger structure on the other hand traverses through said set of lower rings when said stepped hanger structure is coupled to said top ring,
        wherein said ring assembly, including said set of rings and said stepped hanger structure, is configured as a pre-assembled unit to facilitate coupling with said hanger assembly in a twist-n-lock manner using said receiving bore, said shaft passage, and said locking bore.

9. The plasma processing system of claim 8, wherein each of said set of rings is formed of a dielectric material.

10. The plasma processing system of claim 9, wherein said dielectric material is quartz.

11. The plasma processing system of claim 8, wherein said hanger adapter lip portion is positioned in said locking bore during plasma processing.

12. The plasma processing system of claim 8, wherein said top ring is secured by moving said set of rings in a direction substantially parallel to said longitudinal axis of said plunger shaft to insert said hanger adapter lip portion into said receiving bore of said top ring, and then rotating said set of rings to seat said hanger adapter lip portion into said locking bore.

13. The plasma processing system of claim 8, wherein said stepped hanger structure is fixedly coupled to said top ring of said set of rings such that said stepped hanger structure and said top ring are fixed in position relative to one another when said set of lower rings collapse.

14. The plasma processing system of claim 8, wherein said locking bore is counter-sunk in said first surface of said top ring.

* * * * *